US007928815B2

(12) United States Patent
Shigematsu

(10) Patent No.: US 7,928,815 B2
(45) Date of Patent: Apr. 19, 2011

(54) AMPLIFIER

(75) Inventor: Hisao Shigematsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 232 days.

(21) Appl. No.: 12/047,610

(22) Filed: Mar. 13, 2008

(65) Prior Publication Data

US 2008/0231367 A1 Sep. 25, 2008

(30) Foreign Application Priority Data

Mar. 20, 2007 (JP) .................................. 2007-072875

(51) Int. Cl.
*H03H 7/38* (2006.01)
*H03F 3/16* (2006.01)
(52) U.S. Cl. .......................................... 333/32; 330/302
(58) Field of Classification Search .................... 333/32; 330/302, 303, 304, 305, 277, 291
See application file for complete search history.

(56) References Cited

U.S. PATENT DOCUMENTS

| 4,760,350 A * | 7/1988 | Ayasli ............................ 330/277 |
| 6,028,487 A | 2/2000 | Kakuta et al. |
| 6,833,771 B1 * | 12/2004 | Ohta et al. ....................... 333/33 |
| 2004/0124926 A1 | 7/2004 | Kang et al. |
| 2006/0125556 A1 | 6/2006 | Suzuki |

FOREIGN PATENT DOCUMENTS

| JP | 58-121429 U | 8/1983 |
| JP | 62-100006 A | 5/1987 |
| JP | 03-235402 A | 10/1991 |
| JP | 06-252668 A | 9/1994 |
| JP | 07-066609 A | 3/1995 |
| JP | 07-079123 A | 3/1995 |
| JP | 10-004325 A | 1/1998 |
| JP | 10-107552 A | 4/1998 |
| JP | 10-303700 A | 11/1998 |
| JP | 2000-077957 A | 3/2000 |
| JP | 2001-119212 A | 4/2001 |
| JP | 2003-304131 A | 10/2003 |

* cited by examiner

*Primary Examiner* — Stephen E Jones
(74) *Attorney, Agent, or Firm* — Arent Fox LLP

(57) ABSTRACT

An amplifier according to the present invention includes an amplifying transistor, and an impedance converter circuit coupled to an output unit of the amplifying transistor and including a plurality of impedance converting transistors different in input impedance, which are series-connected.

12 Claims, 8 Drawing Sheets

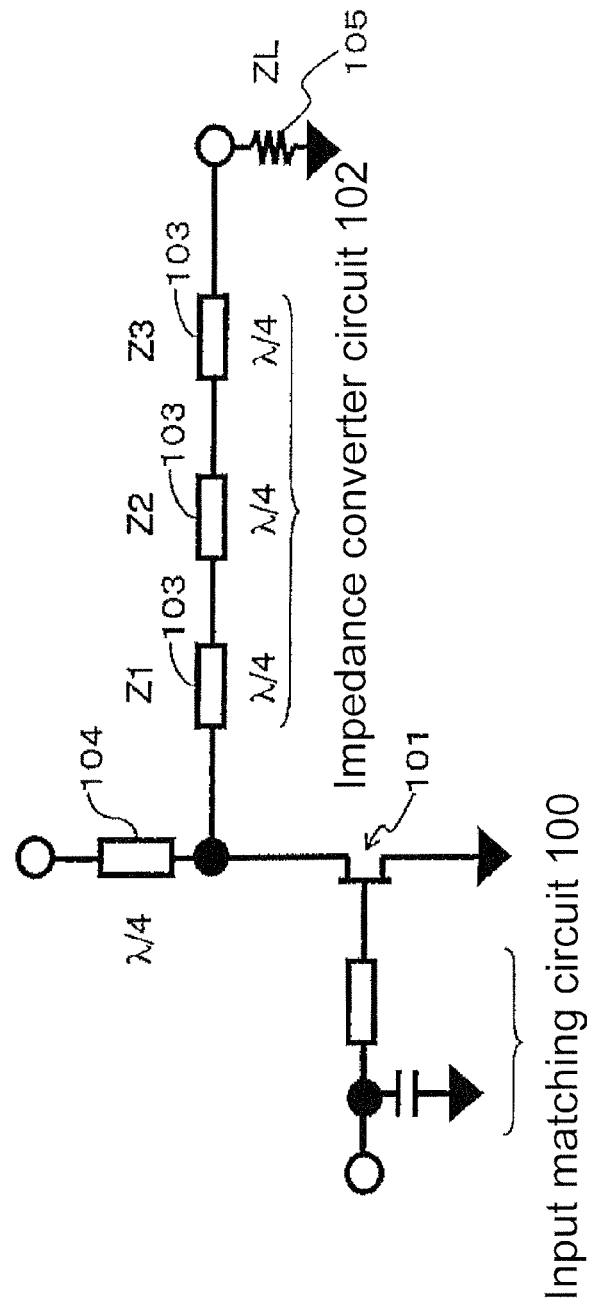

AMPLIFIER

BACKGROUND OF THE INVENTION

1. Field of the Invention

The present invention relates to an amplifier, and more specifically to a high-power amplifier.

2. Description of the Related Art

In recent years, a demand for a wireless communication system capable of transmitting/receiving large-capacity data at a high speed grows along with widespread use of the Internet. A higher power is required of a high-power amplifier as one of the components of the system, in particular, a power amplifier used in a wireless communication base station.

If an amplifier is configured by a large transistor (high-power transistor) for that purpose, an output impedance of the transistor is lowered. Thus, the impedance needs to be converted for load matching (impedance matching).

A conventional microwave high-power amplifier includes, for example, an input matching circuit 100, a high-power transistor 101, and an impedance converter circuit 102 as shown in FIG. 8. In FIG. 8, reference numeral 104 denotes a bias transmission line; 105, a terminal resistor; and Z1, Z2, Z3, and ZL, an impedance value.

The impedance converter circuit 102 includes, for example, a ¼-wavelength transmission line 103 as shown in FIG. 8. Therefore, a line length is increased. In particular, the line length is very long in a low microwave frequency band.

In general, an output impedance of the high-power transistor 101 is as low as about several Ω, for example. Thus, as for an application that requires a wide band, it is necessary to provide three ¼-wavelength transmission lines 103 and execute impedance conversion in three steps as shown in FIG. 8, for example.

As described above, the microwave high-power amplifier has a problem of increasing footprint. In particular, a large space is necessary when a large bandwidth is required.

Further, a hybrid integrated amplifier that combines various components has been hitherto used as a microwave high-power amplifier. This amplifier has a problem about a high mounting cost.

SUMMARY

According to an aspect of an embodiment, there is an amplifier includes: an amplifier; and an impedance converter circuit connected to an output unit of the amplifying transistor and including a plurality of impedance converting transistors different in input impedance, which are series-connected.

BRIEF DESCRIPTION OF THE DRAWINGS

FIG. 8 shows the overall configuration of a conventional high-power amplifier.

DESCRIPTION OF THE PREFERRED EMBODIMENTS

First Embodiment

To begin with, an amplifier according to a first embodiment is described with reference to FIGS. 1 to 3.

The amplifier of this embodiment is a microwave high-power simplifier used in a frequency band of a microwave (inclusive of a low microwave), for example. As shown in FIG. 1, the amplifier includes an input transistor (amplifying transistor) 1, an input matching circuit 2 connected to an input terminal (input unit) of the input transistor 1, and an impedance converter circuit 3 connected to an output terminal (output unit) of the input transistor 1, for example.

Figure 1:
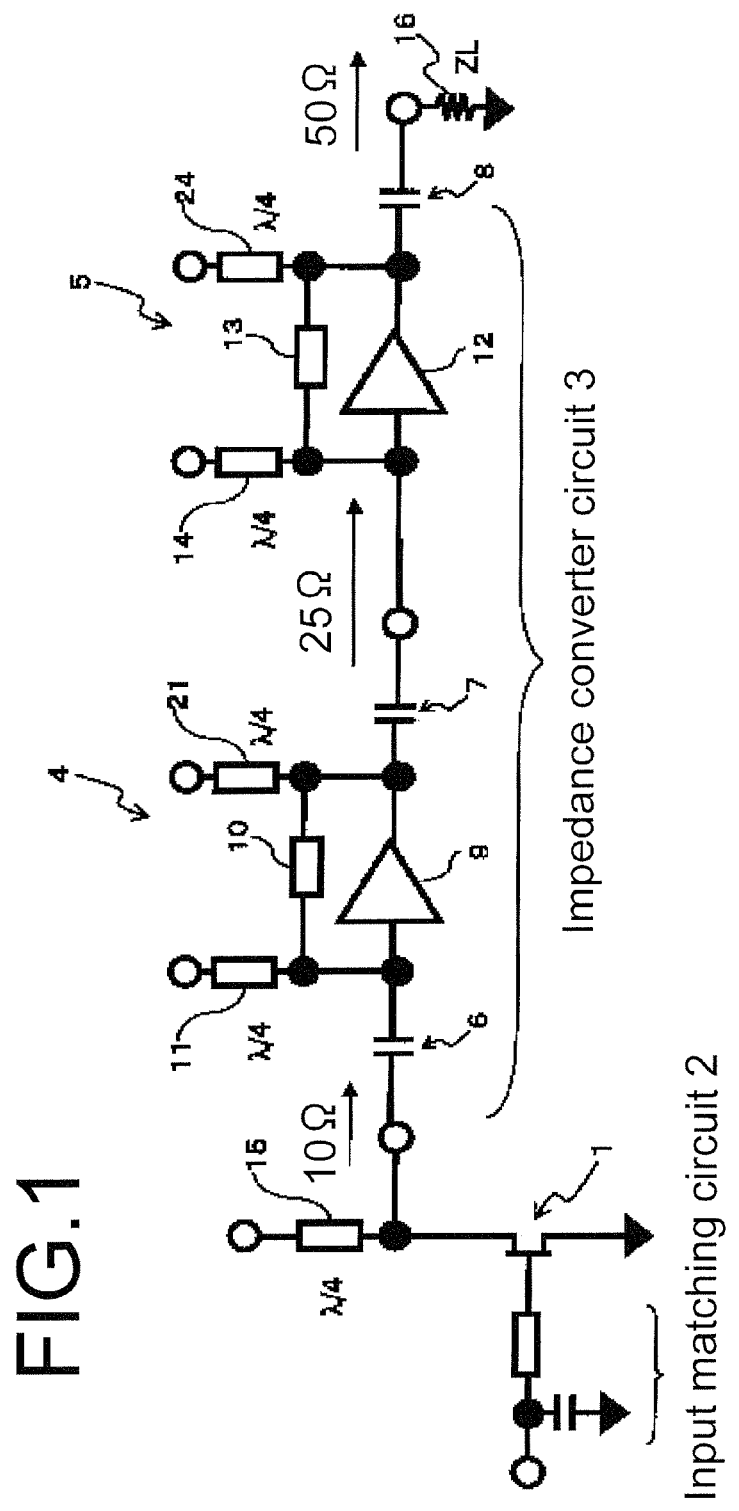
FIG. 1 shows the overall configuration of an amplifier according to a first embodiment.

Here, as shown in FIG. 1, the impedance converter circuit 3 includes a first impedance converting unit 4 and a second impedance converting unit 5, which can convert a low impedance $Z_{low}$ to a high impedance $Z_{high}$ and are connected between the output terminal of the input transistor 1 and a load (not shown) through capacitors 6, 7, and 8. In this way, the impedance converter circuit 3 is composed of plural impedance converting units to thereby enable wide-band impedance matching.

The first impedance converting unit 4 includes an impedance converting transistor 9, a feedback circuit 10 for adjusting an input impedance of the impedance converting transistor 9, and bias ¼-wavelength transmission lines (bias circuits) 11 and 21 for applying a bias to the impedance converting transistor 9. The first impedance converting unit 4 is configured to convert an impedance of 10 Ω to 25 Ω.

Likewise, the second impedance converting unit 5 includes an impedance converting transistor 12, a feedback circuit 13 for adjusting an input impedance of the impedance converting transistor 12, and bias ¼-wavelength transmission lines (bias circuits) 14 and 24 for applying a bias to the impedance converting transistor 12. The second impedance converting unit 5 is configured to convert an impedance of 25 Ω to 50 Ω.

In this way, since the impedance converter circuit 3 includes the feedback circuits 10 and 13, an input impedance of each of the impedance converting transistors 9 and 12 can be more finely controlled. As a result, variations in characteristics of each of the impedance converting transistors 9 and 12 can be absorbed.

In FIG. 1, reference numeral 15 denotes a bias ¼-wavelength transmission line of the input transistor 1; 16, a terminal resistor; and ZL, an impedance value.

Figure 2:
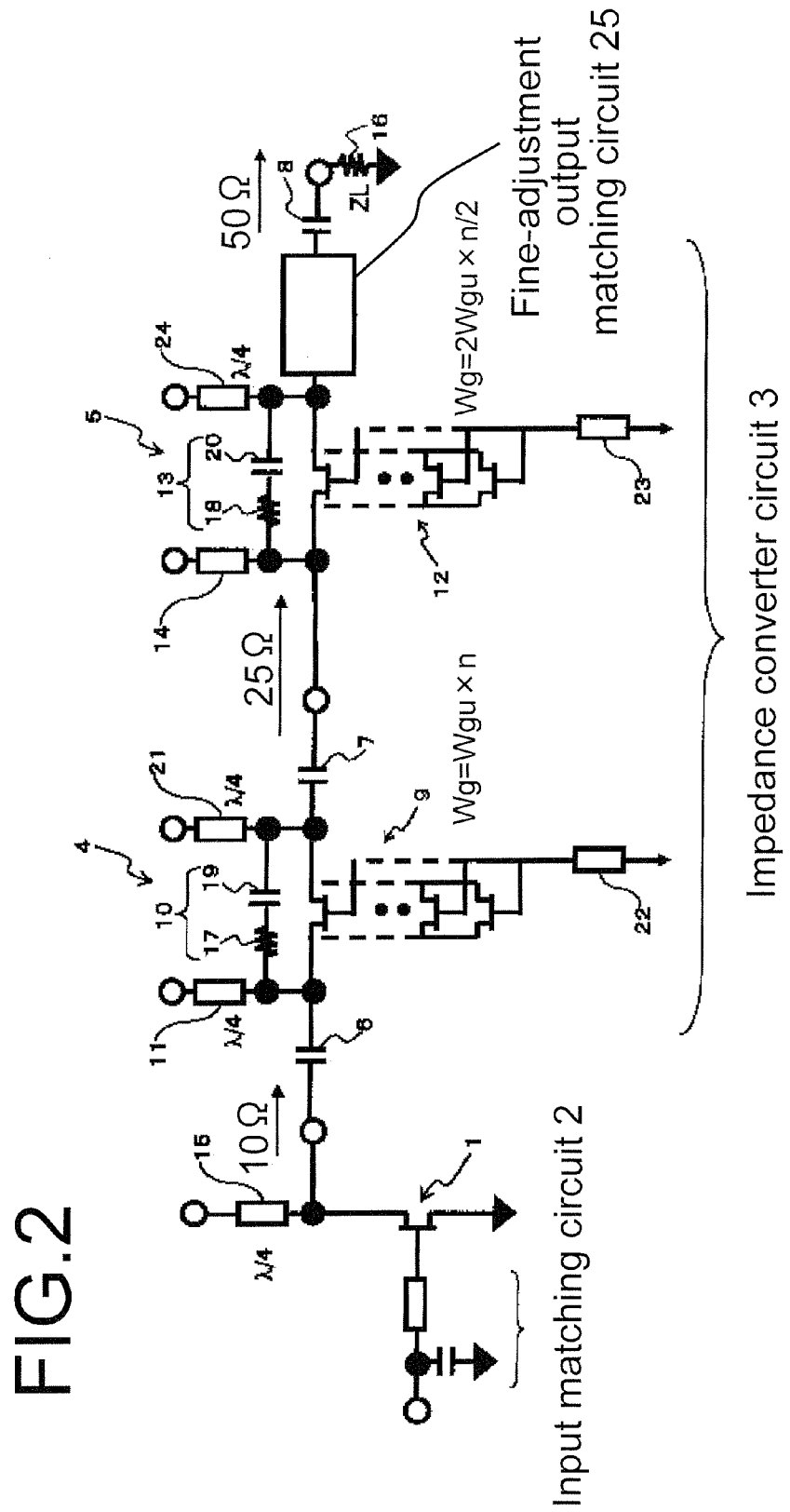
FIG. 2 shows the schematic overall configuration of the amplifier of the first embodiment.

In this embodiment, as shown in FIG. 2, the impedance converter circuit 3 has a transistor pattern where plural (in this example, two) impedance converting transistors (in this example, depletion type (normally on mode) FETs (field effect transistors)) 9 and 12 different in input impedance are series-connected.

In this example, as shown in FIG. 2, the impedance converter circuit 3 includes the transistor 9 having an input impedance of 10 Ω and the transistor 12 having an input impedance of 25 Ω.

In this way, the impedance converter circuit 3 is composed of the transistors different in input impedance and thus can be downsized as compared with a conventional one (composed of ¼-wavelength transmission lines).

In this embodiment, as shown in FIG. 2, plural multi-fingered gate transistors different in the number of fingers are used such that the plural impedance converting transistors 9 and 12 have different input impedance values. That is, the number of fingers of each multi-fingered gate transistor is changed stepwise to thereby convert an impedance stepwise. In FIG. 2, reference symbol $W_g$ denotes a gate width of the entire multi-fingered gate transistor; $W_{gu}$, a gate width of one transistor; and n, the number of transistors.

In particular, in this embodiment, as shown in FIG. 2, the plural impedance converting transistors 9 and 12 are gate-grounded transistors. In FIG. 2, reference numerals 22 and 23 denote a bias ¼-wavelength transmission line for applying a bias to the plural impedance converting transistors 9 and 12.

As shown in FIG. 2, a source and drain of each of the plural impedance converting transistors 9 and 12 are connected to ¼-wavelength transmission lines (or choke coils) constituting the bias circuits 11, 21, 14, and 24, and a bias is applied through the ¼-wavelength transmission lines 11, 21, 14, and 24 as shown in FIG. 2.

As shown in FIG. 2, the impedance converting transistors 9 and 12 are capacitive-coupled with each other through the capacitors 6, 7, and 8. That is, the impedance converting transistors 9 and 12 are capacitive-coupled and applied with the same level of voltage. In this way, a voltage is divided to the capacitive-coupled impedance converting transistors 9 and 12 to thereby achieve a high power within a breakdown voltage of each of the impedance converting transistors 9 and 12.

Incidentally, in this embodiment, as shown in FIG. 2, the feedback circuits 10 and 13 are inserted between a drain and source of each of the impedance converting transistors 9 and 12 and provided with resistors 17 and 18 and capacitors 19 and 20 (either a fixed-capacitance capacitor or a variable-capacitance capacitor), respectively.

As described above, in this embodiment, as shown in FIG. 2, the impedance converter circuit (impedance converter) 3 includes the gate-grounded circuit provided with the feedback circuit.

Further, in this embodiment, as shown in FIG. 2, an output unit of the impedance converter circuit 3 is connected to a fine-adjustment output matching circuit 25. The fine-adjustment output matching circuit 25 is intended to completely match an impedance on the load side (in this example, 50 Ω).

Further, in this embodiment, the thus-configured amplifier is integrated on a semiconductor substrate in a monolithic manner. Hence, the high-power amplifier is also referred to as a "semiconductor amplifier (semiconductor device)".

Therefore, the amplifier according to this embodiment has advantages of achieving a high power within a breakdown voltage as well as reducing mounting space and cost. In particular, the amplifier is advantageous in that a mounting space can be reduced when a large bandwidth is required.

That is, according to the amplifier of this embodiment, a conventional impedance converter circuit configured using ¼-wavelength transmission lines is not used, so a mounting space can be reduced. In particular, a low microwave high-power amplifier does not use a conventional impedance converter configured by ¼-wavelength ceramic transmission lines and thus has an advantage of reducing a mounting cost.

In particular, the amplifier of this embodiment has another advantage of being configured by a small single chip that is completed by integrating the amplifier on a semiconductor substrate in a monolithic manner. As a result, it is unnecessary to integrate plural components in a hybrid manner as in a conventional technique. This produces another advantage of saving a mounting cost.

Figure 3:
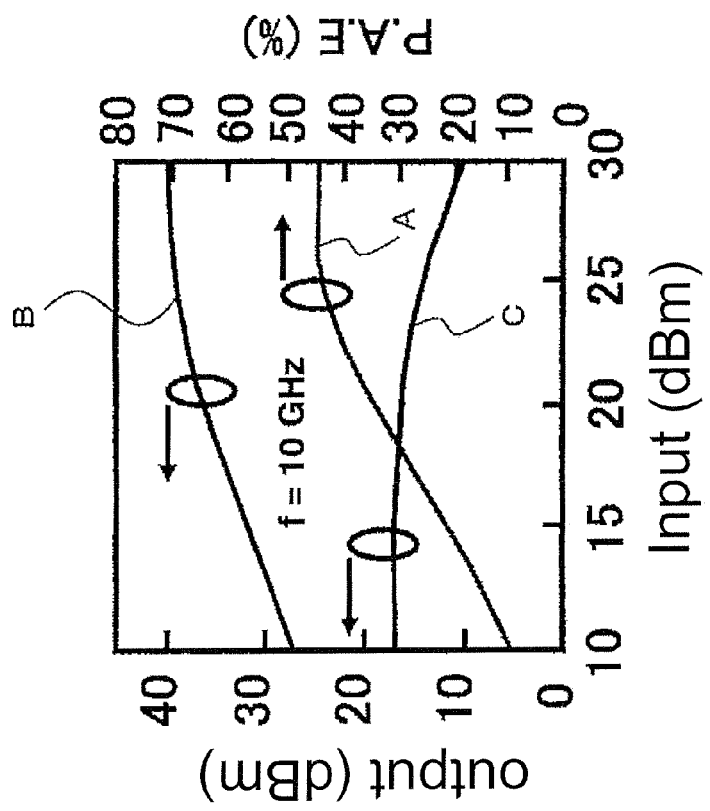
FIG. 3 shows a simulation result of input/output characteristics of the amplifier of the first embodiment.

FIG. 3 shows a simulation result of input/output characteristics of an amplifier provided with three gate-grounded transistors having a power of 4 W as an impedance converting transistor. In FIG. 3, the solid line A indicates a P.A.E (power added efficiency), the solid line B indicates an output power, and the solid line C indicates a gain.

As shown in FIG. 3, an output power is about 12 W, and P.A.E is about 46% at a frequency f=10 GHz.

Second Embodiment

Figure 4:
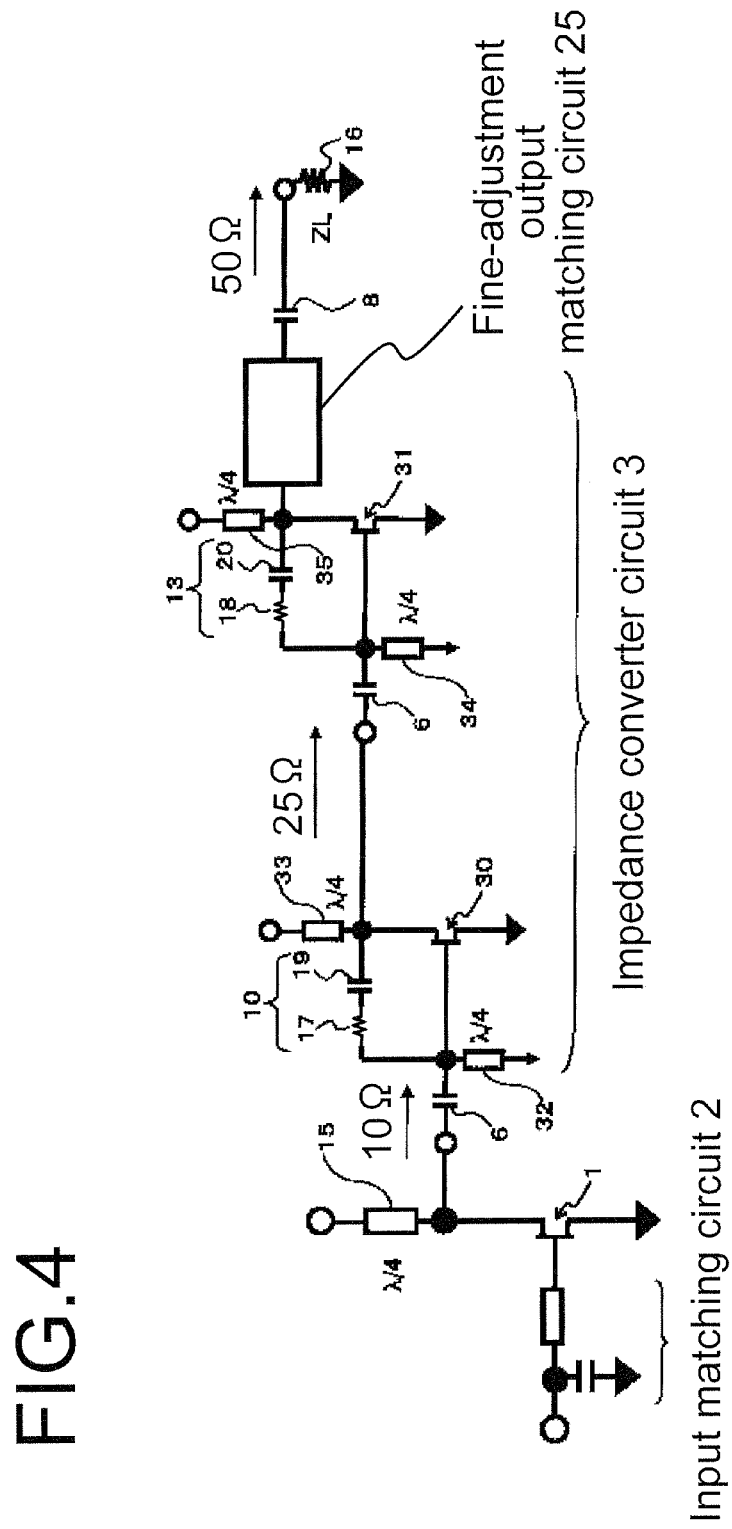
FIG. 4 shows the schematic overall configuration of the amplifier according to a second embodiment.
Figure 5:
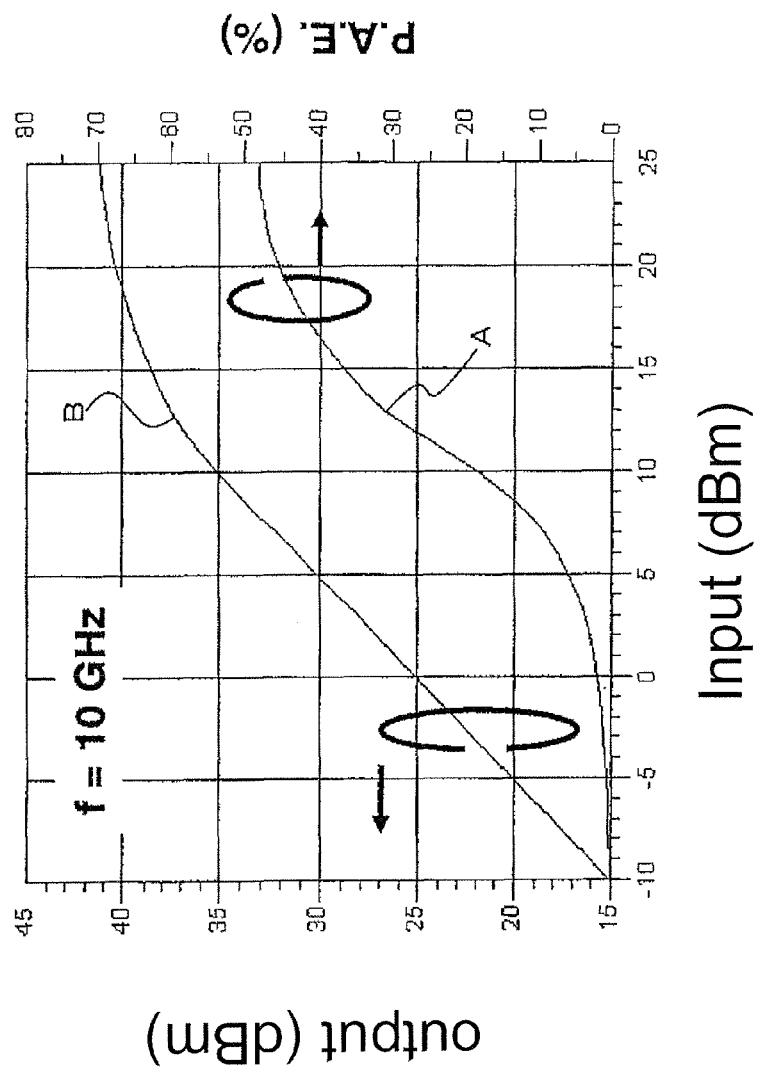
FIG. 5 shows a simulation result of input/output characteristics of the amplifier of the second embodiment.

Referring to FIGS. 4 and 5, an amplifier according to a second embodiment is described next.

The amplifier of this embodiment differs from that of the first embodiment in that source-grounded transistors 30 and 31 are used as impedance converting transistors (in this example, depletion type (normally on mode) FETs (field effect transistors)) which constitute the impedance converter circuit 3 as shown in FIG. 4. In FIG. 4, the same components as those of the first embodiment (see FIG. 2) are denoted by identical reference numerals. In FIG. 4, bias λ/4-wavelength transmission lines 32 to 35 apply a bias to the impedance converting transistors 30 and 31.

That is, in this embodiment, as shown in FIG. 4, the impedance converter circuit (impedance converter) 3 includes the source-grounded circuit provided with the feedback circuit.

In this example, as shown in FIG. 4, the impedance converter circuit 3 includes the transistor 30 having an input impedance of 15 Ω and the transistor 31 having an input impedance of 25 Ω.

As shown in FIG. 4, a gate and drain of each of the impedance converting transistors 30 and 31 are connected to ¼-wavelength transmission lines (or choke coils) constituting the bias circuits 32 to 35, and a bias is applied through the ¼-wavelength transmission lines 32 to 35.

As shown in FIG. 4, the impedance converting transistors 30 and 31 are capacitive-coupled with each other through the capacitors 6, 7, and 8. That is, the impedance converting transistors 30 and 31 are capacitive-coupled and applied with the same level of voltage. In this way, a voltage is divided to the capacitive-coupled impedance converting transistors 30 and 31 to thereby achieve a high power within a breakdown voltage of each of the impedance converting transistors 30 and 31.

Further, in this embodiment, as shown in FIG. 4, the feedback circuits 10 and 13 are inserted between a drain and gate of each of the impedance converting transistors 30 and 31 and provided with a resistor and a capacitor (either a fixed-capacitance capacitor or a variable-capacitance capacitor).

The other components are the same as those of the above first embodiment, so description thereof is omitted here.

The amplifier of this embodiment has advantages of achieving a high power within a breakdown voltage as well as reducing mounting space and cost. In particular, the amplifier is advantageous in that a mounting space can be reduced when a large bandwidth is required similar to that of the above first embodiment.

FIG. 5 shows a simulation result of input/output characteristics of an amplifier provided with three source-grounded transistors having a power of 4 W as an impedance converting transistor. In FIG. 5, the solid line A indicates a P.A.E (power added efficiency), and the solid line B indicates an output power.

As shown in FIG. 5, an output power is about 12 W, and P.A.E is about 48% at a frequency f=10 GHz.

Third Embodiment

Figure 6:
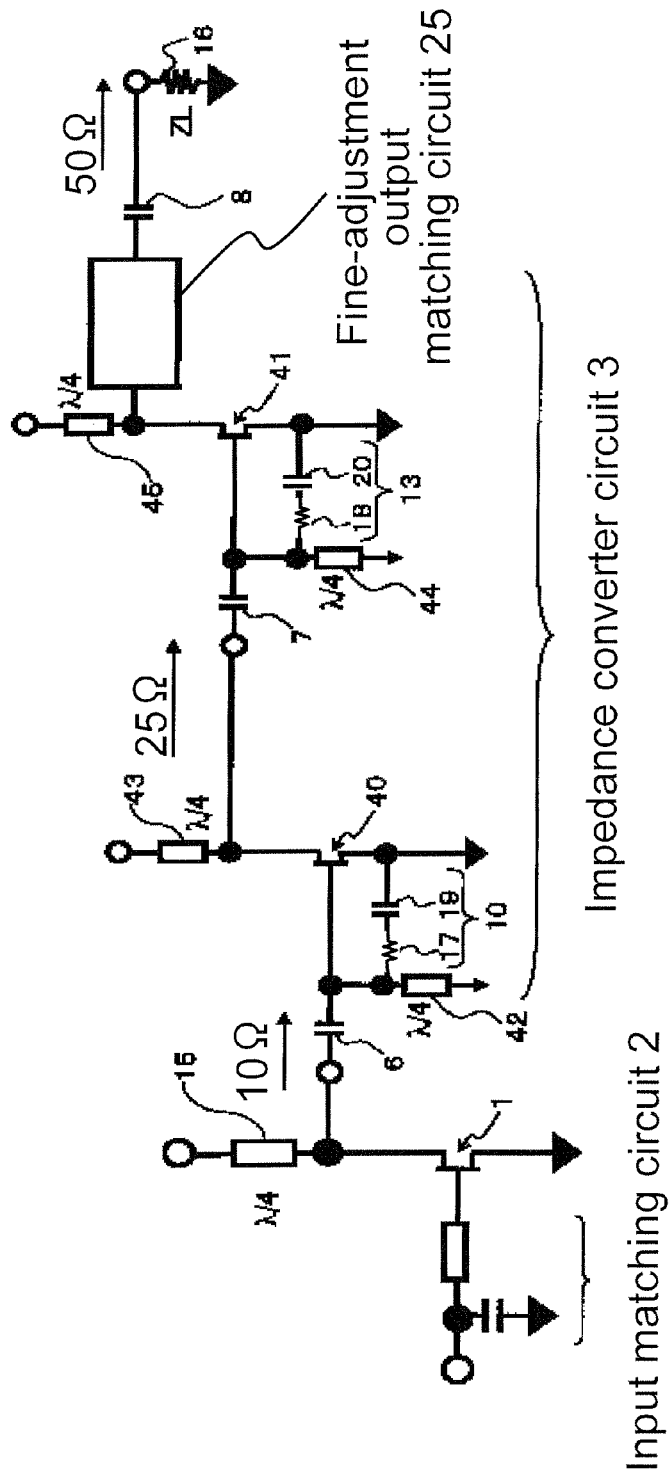
FIG. 6 shows the schematic overall configuration of the amplifier according to a third embodiment.

Referring to FIG. 6, an amplifier according to a third embodiment is described next.

The amplifier of this embodiment differs from that of the first embodiment in that source-grounded transistors 40 and 41 are used as impedance converting transistors (in this example, depletion type (normally on mode) FETs (field effect transistors)) which constitute the impedance converter circuit 3 as shown in FIG. 6. Further, the amplifier differs from that of the second embodiment in that the impedance converter circuit (impedance converter) 3 is provided with a source-grounded circuit having a feedback circuit between its gate and source. In FIG. 6, the same components as those of the first embodiment (see FIG. 2) and the second embodiment (see FIG. 4) are denoted by identical reference numerals. In FIG. 6, bias ¼-wavelength transmission lines 42 to 45 apply a bias to the impedance converting transistors 40 and 41.

In this example, as shown in FIG. 6, the impedance converter circuit 3 includes the transistor 40 having an input impedance of 10 Ω and the transistor 41 having an input impedance of 25 Ω.

A gate and drain of each of the impedance converting transistors 40 and 41 are connected to ¼-wavelength transmission lines (or choke coils) constituting the bias circuits 42 to 45, and a bias is applied through the ¼-wavelength transmission lines 42 to 45 as shown in FIG. 6.

As shown in FIG. 6, the impedance converting transistors 40 and 41 are capacitive-coupled with each other through the capacitors 6, 7, and 8. That is, the impedance converting transistors 40 and 41 are capacitive-coupled and applied with the same level of voltage. In this way, a voltage is divided to the capacitive-coupled impedance converting transistors 40 and 41 to thereby achieve a high power within a breakdown voltage of each of the impedance converting transistors 30 and 31.

Further, in this embodiment, as shown in FIG. 6, the feedback circuits 10 and 13 are inserted between a gate and source of each of the impedance converting transistors 40 and 41 and provided with a resistor and a capacitor (either a fixed-capacitance capacitor or a variable-capacitance capacitor).

The other components are the same as those of the above first embodiment, so description thereof is omitted here.

The amplifier of this embodiment has advantages of achieving a high power within a breakdown voltage as well as reducing mounting space and cost. In particular, the amplifier is advantageous in that a mounting space can be reduced when a large bandwidth is required similar to that of the above first embodiment.

Other Embodiments

The above embodiments describe the case where the depletion type (normally on mode) field effect transistors (FETs) are used as the impedance converting transistor, but the present invention is not limited thereto. For example, an enhancement type (normally off mode) field effect transistor (FET), a bipolar junction transistor (BJT), a CMOS transistor, and the like can be used. If these transistors are used, similar effects can be attained.

In particular, in the case of using the enhancement type (normally off mode) field effect transistor (FET), the bipolar junction transistor (BJT), the CMOS transistor, or the like, a feedback circuit is provided with a resistor.

Figure 7:
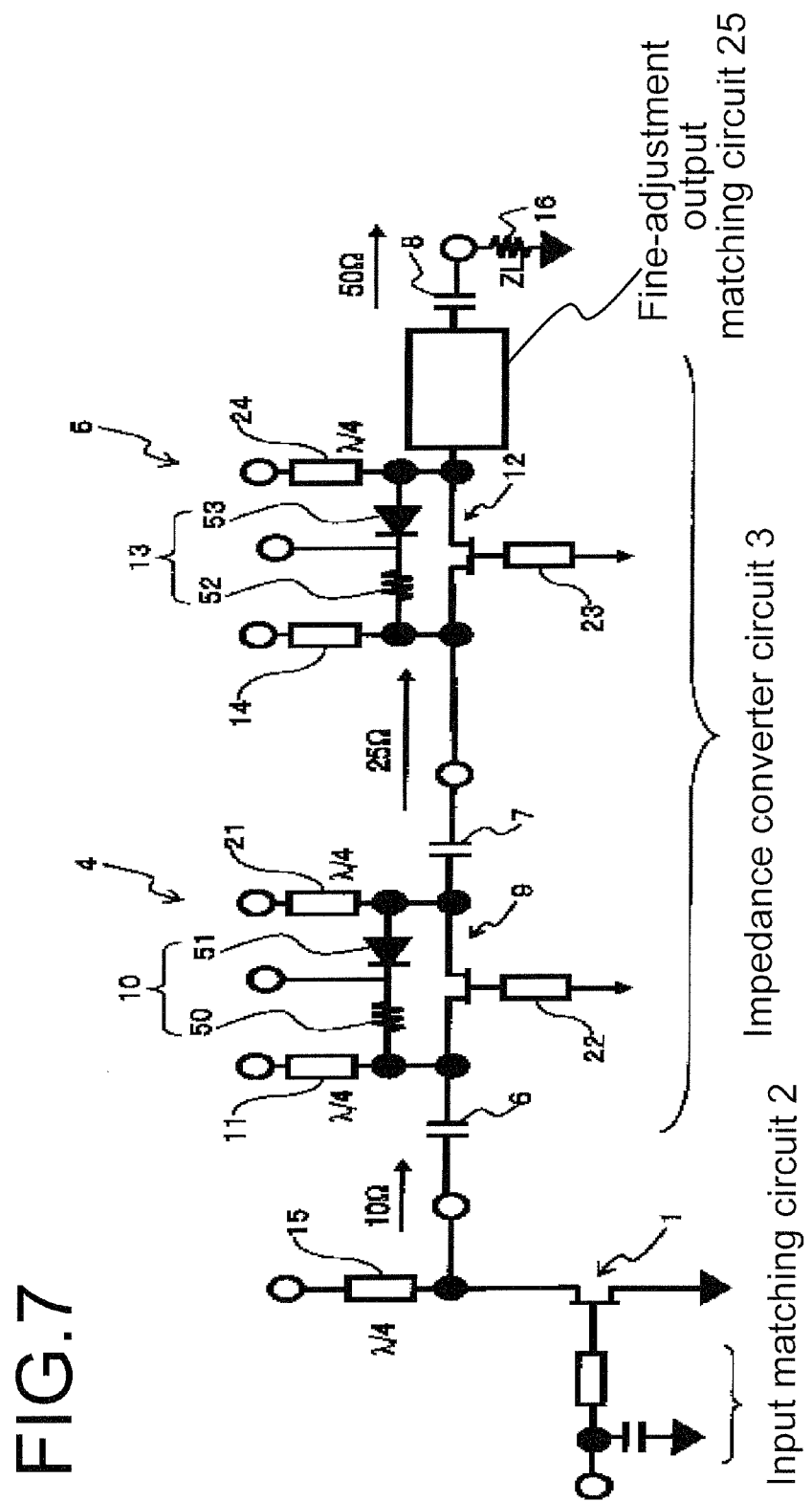
FIG. 7 shows the schematic overall configuration of an amplifier according to a modified example of each of the embodiments.

Further, in the above embodiments, the feedback circuit is provided with a resistor and a capacitor, but the present invention is not limited thereto. For example, as shown in FIG. 8, the feedback circuits 10 and 13 may be provided with a variable-capacitance diode 51 and a resistor 50, and a variable-capacitance diode 53 and a resistor 52, respectively. Here, the feedback circuits 10 and 13 may be provided with the resistors 50 and 52. In FIG. 7, the same components as those of the first embodiment (see FIG. 2) are denoted by identical reference numerals.

Further, the amplifier of the above embodiments is integrated on the semiconductor substrate in a monolithic manner. For example, GaAs, InP, Si, GaN, etc. can be used as a semiconductor material.

In the above embodiments, the impedance converter circuit has a two-stage structure including two impedance converting circuits and converts an impedance in two steps. However, the present invention is not limited thereto but is applicable to a multistage structure, for example, a three-stage structure. In this case, a higher-power input transistor can be attained, so a higher power can be achieved. In addition, wider-band impedance matching can be performed.

Further, from the viewpoint of increasing a bandwidth, it is preferred to use the gate-grounded transistors 9 and 12 as the impedance converting transistors that constitute the impedance converter circuit 3 as in the first embodiment. However, even if the source-grounded transistors are used as in the second and third embodiments, an input impedance of the transistor can be reduced by increasing a transistor size or a feedback amount of the feedback circuits 10 and 13, so the completed amplifier is very useful.

The present invention is not limited to the above embodiments and encompasses various modifications without departing from the scope of the present invention.

The embodiments are supplemented with the following appendixes.

What is claimed is:

1. An amplifier comprising:
   an amplifying transistor;
   an impedance converter circuit coupled to an output unit of the amplifying transistor and including a plurality of impedance converting transistors different in input impedance, which are series-connected; and
   a feedback circuit for adjusting the input impedance.

2. The amplifier according to claim 1, wherein the impedance converting transistor is a gate-grounded transistor, and
   the feedback circuit is provided between a drain and a source of the impedance converting transistor.

3. The amplifier according to claim 1, wherein the impedance converting transistor is a source-grounded transistor, and
   the feedback circuit is provided between a drain and a gate of the impedance converting transistor.

4. The amplifier according to claim 1, wherein the impedance converting transistor is a source-grounded transistor, and
   the feedback circuit is provided between a gate and a source of the impedance converting transistor.

5. The amplifier according to claim 1, wherein the feedback circuit includes a resistor.

6. The amplifier according to claim 1, wherein the feedback circuit includes a resistor and a capacitor.

7. The amplifier according to claim 1, wherein the feedback circuit includes a variable-capacitance diode.

8. The amplifier according to claim 1, wherein the plurality of impedance converting transistors are capacitive-coupled with one another.

9. The amplifier according to claim 1, further comprising a fine-adjustment output matching circuit connected to an output unit of the impedance converter circuit.

10. The amplifier according to claim 1, wherein the amplifier is integrated on a semiconductor substrate in a monolithic manner.

11. The amplifier according to claim 1, wherein the plurality of impedance converting transistors are multi-fingered gate transistors.

12. The amplifier according to claim 9, wherein the plurality of impedance converting transistors differ from one another in the number of fingers.

* * * * *